US008019299B1

(12) United States Patent
Moyal et al.

(10) Patent No.: US 8,019,299 B1
(45) Date of Patent: Sep. 13, 2011

(54) RADIO COMMUNICATION DEVICE AND METHOD

(75) Inventors: Nathan Moyal, West Linn, OR (US); David G. Wright, San Diego, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 680 days.

(21) Appl. No.: 11/154,097

(22) Filed: Jun. 15, 2005

Related U.S. Application Data

(60) Provisional application No. 60/583,248, filed on Jun. 25, 2004.

(51) Int. Cl.
*H04B 1/18* (2006.01)

(52) U.S. Cl. ............... 455/166.2; 455/161.2; 455/165.1; 455/260

(58) Field of Classification Search .... 455/161.1–161.3, 455/165.1, 167.1, 168.1, 196.1, 260, 166.2
See application file for complete search history.

(56) References Cited

U.S. PATENT DOCUMENTS

| | | | | |
|---|---|---|---|---|
| 5,408,682 A * | 4/1995 | Ranner et al. | ............... | 455/166.2 |
| 5,491,458 A | 2/1996 | McCune, Jr. et al. | ......... | 332/144 |
| 5,551,071 A * | 8/1996 | Nakano et al. | ............. | 455/161.2 |
| 5,651,035 A | 7/1997 | Tozun et al. | .................... | 375/373 |
| 5,666,655 A * | 9/1997 | Ishikawa et al. | .............. | 455/512 |
| 5,886,582 A | 3/1999 | Stansell | ......................... | 331/1 A |
| 5,952,888 A | 9/1999 | Scott | ................................. | 331/2 |
| 6,087,865 A * | 7/2000 | Bradley | ........................ | 327/117 |
| 6,172,571 B1 | 1/2001 | Moyal et al. | ..................... | 331/11 |
| 6,198,353 B1 * | 3/2001 | Janesch et al. | .................. | 331/16 |
| 6,211,741 B1 | 4/2001 | Dalmia | ............................ | 331/11 |
| 6,272,646 B1 | 8/2001 | Rangasayee et al. | ......... | 713/500 |
| 6,307,413 B1 | 10/2001 | Dalmia et al. | ................. | 327/166 |
| 6,310,521 B1 | 10/2001 | Dalmia | ............................ | 331/11 |
| 6,369,660 B1 | 4/2002 | Wei et al. | ......................... | 331/15 |
| 6,377,646 B1 | 4/2002 | Sha | ................................. | 375/376 |
| 6,417,703 B1 * | 7/2002 | Bradley | ......................... | 327/105 |
| 6,445,211 B1 | 9/2002 | Saripella | ......................... | 326/83 |
| 6,466,078 B1 | 10/2002 | Stiff | ............................... | 327/536 |
| 6,553,057 B1 | 4/2003 | Sha et al. | ........................ | 375/130 |
| 6,560,306 B1 | 5/2003 | Duffy et al. | ..................... | 375/376 |
| 6,650,721 B1 * | 11/2003 | Janesch et al. | ................ | 375/376 |
| 6,667,642 B1 | 12/2003 | Moyal | ............................ | 327/156 |
| 6,683,930 B1 | 1/2004 | Dalmia | ........................... | 375/376 |
| 6,690,224 B1 | 2/2004 | Moore | ............................ | 327/296 |
| 6,704,381 B1 | 3/2004 | Moyal et al. | ................... | 375/374 |
| 6,782,068 B1 | 8/2004 | Wilson et al. | ................. | 375/376 |

(Continued)

OTHER PUBLICATIONS

USPTO Notice of Allowance for U.S. Appl. No. 08/549,915 dated Apr. 8, 1997; 3 pages.

(Continued)

*Primary Examiner* — Edward Urban
*Assistant Examiner* — RuiMeng Hu

(57) ABSTRACT

One embodiment includes a system configured to identify a preferred channel for radio communication from a plurality of consecutive integer frequencies including preferred channels and non-preferred channels, the system further to generate a plurality of radio channels corresponding to a plurality of consecutive integer frequencies based on a generation of reference frequencies, identifies preferred channels and non-preferred channels from the plurality of radio channels, where frequency synthesizer settling times of the preferred channels are faster than frequency synthesizer settling times of the non-preferred channels, scan the preferred channels for radio activity, select one of preferred channels responsive to the scanned radio activity; and utilize one of the reference frequencies to generate a radio frequency corresponding to the selected one of the preferred channels.

17 Claims, 6 Drawing Sheets

U.S. PATENT DOCUMENTS

| | | | |
|---|---|---|---|
| 6,850,554 B1 | 2/2005 | Sha et al. ..................... 375/140 |
| 2002/0082010 A1* | 6/2002 | Koorapaty et al. ............ 455/434 |
| 2006/0258311 A1* | 11/2006 | Pestryakov et al. ........ 455/165.1 |

OTHER PUBLICATIONS

USPTO Non-Final Rejection for U.S. Appl. No. 08/549,915 dated May 24, 1996; 3 pages.

USPTO Notice of Allowance for U.S. Appl. No. 08/587,659 dated Nov. 12, 1997; 1 page.

USPTO Non-Final Rejection for U.S. Appl. No. 08/587,659 dated Jun. 13, 1997; 5 pages.

USPTO Notice of Allowance for U.S. Appl. No. 08/626,043 dated Feb. 11, 1998; 6 pages.

USPTO Non-Final Rejection for U.S. Appl. No. 08/626,043 dated Aug. 26, 1997; 7 pages.

USPTO Notice of Allowance for U.S. Appl. No. 09/849,164 dated Jun. 17, 2002; 5 pages.

USPTO Non-Final Rejection for U.S. Appl. No. 09/849,164 dated Dec. 19, 2001; 8 pages.

USPTO Notice of Allowance for U.S. Appl. No. 09/283,058 dated Feb. 11, 2000; 1 page.

USPTO Notice of Allowance for U.S. Appl. No. 09/436,155 dated Dec. 16, 2002; 6 pages.

USPTO Non-Final Rejection for U.S. Appl. No. 09/436,155 dated Oct. 11, 2002; 5 pages.

USPTO Non-Final Rejection for U.S. Appl. No. 09/436,522 dated Oct. 3, 2002; 13 pages.

USPTO Final Rejection for U.S. Appl. No. 09/436,522 dated Jul. 30, 2003; 5 pages.

USPTO Non-Final Rejection for U.S. Appl. No. 09/436,522 dated Oct. 6, 2003; 9 pages.

USPTO Non-Final Rejection for U.S. Appl. No. 09/436,522 dated Mar. 15, 2004; 10 pages.

USPTO Notice of Allowance for U.S. Appl. No. 09/465,565 dated Dec. 16, 2002; 6 pages.

USPTO Non-Final Rejection for U.S. Appl. No. 09/465,565 dated Jul. 17, 2002; 4 pages.

USPTO Final Rejection for U.S. Appl. No. 09/465,565 dated May 8, 2002; 8 pages.

USPTO Non-Final Rejection for U.S. Appl. No. 09/465,565 dated Oct. 16, 2001; 5 pages.

USPTO Non-Final Rejection for U.S. Appl. No. 09/465,565 dated Apr. 9, 2001; 8 pages.

USPTO Non-Final Rejection for U.S. Appl. No. 09/465,565 dated Sep. 26, 2000; 8 pages.

USPTO Notice of Allowance for U.S. Appl. No. 09/470,665 dated Sep. 24, 2003; 4 pages.

USPTO Non-Final Rejection for U.S. Appl. No. 09/470,665 dated Apr. 25, 2003; 6 pages.

USPTO Non-Final Rejection for U.S. Appl. No. 09/470,665 dated Nov. 21, 2002; 4 pages.

USPTO Notice of Allowance for U.S. Appl. No. 09/436,522 dated Oct. 4, 2004; 8 pages.

USPTO Non-Final Rejection for U.S. Appl. No. 09/893,161 dated Jun. 18, 2003; 9 pages.

USPTO Notice of Allowance for U.S. Appl. No. 09/893,161 dated Sep. 23, 2003; 6 pages.

USPTO Non-Final Rejection for U.S. Appl. No. 09/436,522 dated Jan. 29, 2003; 6 pages.

USPTO Supplemental Final Rejection for U.S. Appl. No. 09/608,753 dated Feb. 25, 2004; 3 pages.

* cited by examiner

RADIO COMMUNICATION DEVICE AND METHOD

This application claims priority from U.S. Provisional Patent Application Ser. No. 60/583,248, filed Jun. 25, 2004, the contents of which are incorporated herein by reference in their entirety.

BACKGROUND OF THE INVENTION

In conventional radio systems or ICs, a frequency synthesizer may be used to generate the transmit carriers and/or the receiver Intermediate Frequency (IF). The synthesizer typically includes a Phase Locked Loop (PLL) frequency multiplier that generates the desired high frequency from a lower oscillator frequency. The lower oscillator frequency is typically generated using a quartz crystal. Typical crystal frequencies used are 12, 16, or 20 MHz.

The synthesizer must be able to generate a range of carrier and IF frequencies across the frequency range of operation of the radio. A conventional radio designed to operate in the worldwide 2.4 GHz ISM band is one example. A typical such device may support eighty four, 1 MHz radio channels, with the lowest channel being 2400 MHz and the highest being 2483 MHz.

Such radio devices or systems are often used to transmit relatively small packets of data, and are bi-directional. One example is a wireless mouse or keyboard. Such devices typically transmit only a few bytes at a time. In order to provide a robust data link, such systems may use a bi-directional radio system, with all data transfers being acknowledged using a handshake packet transmitted by the receiver after correct reception of a data packet. When not actively sending data (or receiving a handshake), such radio systems typically operate in a low power mode, as they are battery powered and power conservation is extremely desirable.

Typically, a conventional radio device of the type described above will transmit a pre-amble (conventionally a 1010101 . . . pattern) at the beginning of a transmission in order to allow the receiver to lock on to the transmitted signal. The receiver may, for example, use the pre-amble pattern to set the thresholds on its data slicer. The current drawn by the synthesizer is typically a significant proportion of the current drawn by the radio in its transmit and receive modes. The pre-amble is typically about 32 μs in duration.

Frequency synthesizers used in conventional applications typically take 100-200 μs to settle at the desired frequency. When switching between transmit and receive modes, it is necessary for the synthesizer to change frequency because the frequency required in the receive mode is offset from the transmit carrier frequency by the IF frequency. The timing of a packet transfer between a transmitter and a receiver may therefore be as shown in FIG. 1.

As can be seen from the timing diagram of FIG. 1, the synthesizer settling period may dominate the time that the radio is in its high current modes. For short data packets, the settling periods drive the power consumed by the radio in transmitting a packet. Any reduction in synthesizer settling current will therefore directly reduce the power consumed in sending a data packet, and so increase the battery life of the radio device.

FIG. 2 is a somewhat schematic block diagram of a conventional synthesizer 200. In the conventional synthesizer implementation 200 shown in FIG. 2, the typical time required for the synthesizer to settle may be significantly less than the worst case. In this case, it is possible for the "transmitter" to begin sending data as soon as the synthesizer is detected as having settled, rather than always waiting for a fixed worst-case lock period. Unfortunately, however, this is not possible when the synthesizer re-settles after the "receiver" sends the handshake and switches between reception and transmission. This is because of the danger that the synthesizer in the "receiver" will settle before that of the "transmitter" and so send the handshake before the "transmitter" is ready to receive the handshake. Therefore, in that case, the fixed, worst case synthesizer settling time must be used.

As shown in FIG. 2, the conventional synthesizer includes a phase divider 210, a loop filter 220, a voltage controlled oscillator (VCO) 230, and a divide by N counter 240. In the conventional method, the phase divider 210 divides the incoming 20 MHz XTAL frequency down to 1 MHz in order to obtain N*1 MHz channel resolution. The VCO frequency is equal to the N counter integer value multiplied by the reference frequency (REF). For example, where:

N0=2400
N1=2401
N2=2402
. . .
N80=2480 then:

VCO Freq=N*Ref
2400 Mhz=2400*1 Mhz
2401 Mhz=2401*1 Mhz
2402 Mhz=2402*1 Mhz
. . .
2480 Mhz=2480*1 Mhz The settling time is inversely proportional to the REF frequency, in this case 1 MHz.

In order to minimize the power consumption in a conventional radio system as shown in FIG. 3, it is necessary to minimize both the typical and worst case synthesizer settling times. In many radio systems of this type, the choice of channel is arbitrary. The large number of channels (for example eighty-four channels) available may be vital in supporting applications where there may be many similar radio systems operating within range of each other, or when operating in the presence of other (non-compatible) radio systems that use that same frequency band, and so block some of the channels from being useable by the radio system in question. However, even in radio system that must support such a large number of channels, in the great majority of applications or installations, it will be rare for every channel to be used.

Referring to FIG. 3, a conventional radio system includes a phase lock loop (PLL) circuit 200 receiving a reference frequency signal (such as from a crystal) and outputting a radio channel frequency. PLL logic 310 provides divide control and PLL loop compensation. In the conventional method, the VCO frequency is equal to the N counter integer value multiplied by the reference frequency divided by an M counter integer value. Assuming a 20 MHz reference frequency, for instance, and an M counter value of 20, the resulting VCO frequencies would be the same as above given the same N counter values.

Unfortunately, this conventional technology has several disadvantages. For instance, existing radio systems with frequency synthesizers used for both TX carrier generation and RX IF generation have the disadvantage that the power consumed when transmitting data is the same on all channels. The channels with the slowest settling time therefore determine the power consumed by the system. Moreover, the higher reference frequency is more immune to filter leakage (PLL drift) and the higher reference frequency is easier to simulate.

It would be desirable, therefore, to have a system that enabled faster settling time and lower power use in radio communication.

SUMMARY OF THE INVENTION

According to an embodiment of the present invention, an improved radio device having a synthesizer architecture provides an average settling time that is significantly reduced on a subset of the channels supported and thereby provides improved power consumption characteristics. A radio system preferably incorporates a radio having a subset of channels with faster settling times designated as being "preferred" channels. A method of reducing power consumption in a radio system by scanning and selecting preferred channels before non-preferred channels is also disclosed. Preferred channels preferably are those with lower power consumption requirements due, for instance, to faster settling times.

BRIEF DESCRIPTION OF THE DRAWINGS

The foregoing objects, features, and advantages of the present invention will become more readily apparent from the following detailed description of preferred embodiments thereof, made with reference to the accompanying figures, in which.

DETAILED DESCRIPTION

An improved radio device with a synthesizer architecture is described in which the average settling time is significantly reduced on a subset of the channels supported, and power consumption is thereby improved. A radio system is also described which incorporates such a radio having a subset of channels designated as being "preferred" channels. Various sample embodiments of the present inventive principles will now be described below with reference to FIGS. 5 and 6.

Figure 5:
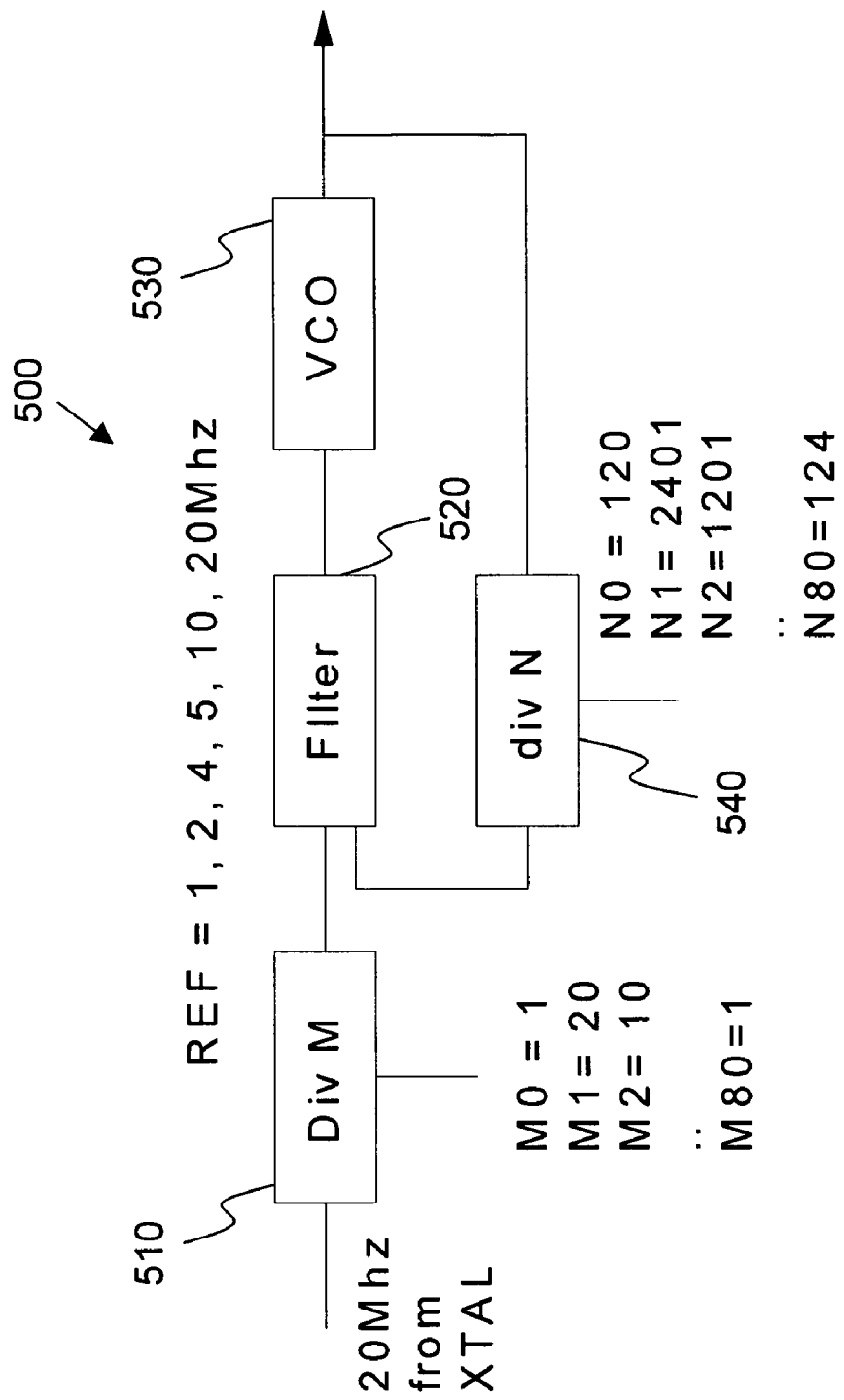
FIG. 5 is a somewhat schematic block diagram illustrating an architecture of an improved PLL solution according to a preferred embodiment of the present invention.
Figure 6:
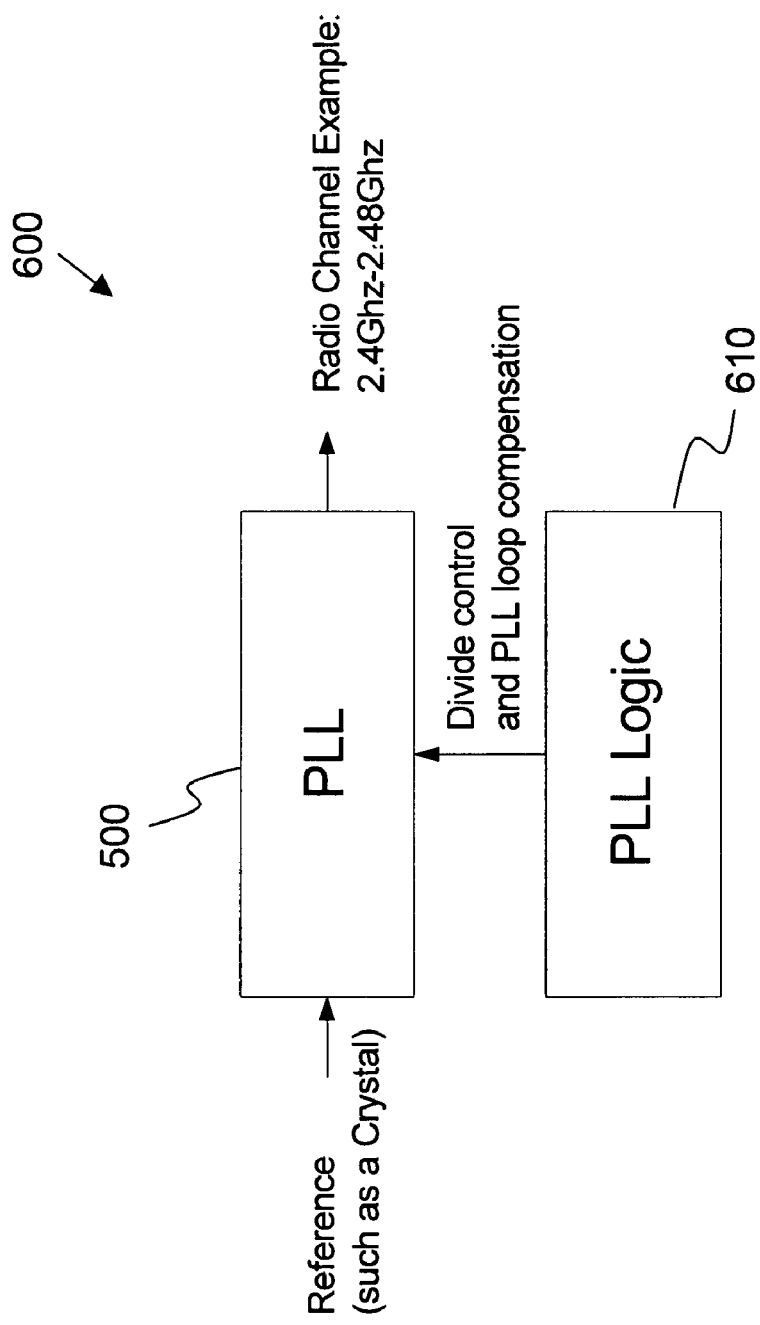
FIG. 6 is a somewhat schematic block diagram showing an improved radio system including the improved PLL solution of FIG. 5 according to another aspect of the present invention.

FIG. 5 illustrates an architecture of an improved PLL solution according to a preferred embodiment of the present invention. In FIG. 6, an improved radio system is illustrated which preferably includes the improved phase lock loop (PLL) synthesizer architecture shown in FIG. 5. Referring to FIG. 5, an improved PLL solution 500 preferably includes a frequency divider 510, a filter 520, a VCO 530, and a divide by N counter 540. In this embodiment, the XTAL frequency is divided down into a range of various reference frequencies (e.g., REF=1, 2, 4, 5, 10, 20 MHz) using the frequency divider 510. The lowest integer multiple from an M counter is preferably used by the frequency divider 510 to obtain the desired frequency. Again, the VCO frequency is equal to the N integer counter value multiplied by the reference frequency. In this case, where:

M0=1
M1=20
M2=10
. . .
M80=1 and

N0=120
N1=2401
N2=1201
. . .
N80=184 then

VCO Freq=N*Ref
2400 MHz=120*20 MHz
2401 MHz=2401*1 MHz
2402 MHz=1201*2 MHz
. . .
2480 MHz=124*20 MHz Again, the settling time is inversely proportional to the reference frequency (REF). Using this approach, 1 MHz resolution is available, but the average PLL settling time is improved. For instance, the average settling time using the reference frequencies REF=1, 2, 4, 5, 10, 20 MHz is much faster than the average settling time for a 1 MHz reference frequency.

Referring to FIG. 6, an improved radio system 600 preferably includes a PLL 500 and PLL Logic 610. In this system 600, the PLL 500 receives a reference frequency from a reference source (such as a crystal) and control input from the PLL Logic 610. The radio system outputs on a selected radio channel. Preferably, M and N counters are used to generate the VCO frequency of the PLL. The following chart illustrates various M and N counter values used to generate various VCO frequencies in this embodiment. Again, this chart assumes a 20 MHz reference frequency input into the PLL 500.

| | | |
|---|---|---|
| M0 counter = 1 | N counter = 120 | VCO Freq = 2400 |
| M1 counter = 20 | N counter = 2401 | VCO Freq = 2401 |
| M2 counter = 10 | N counter = 1201 | VCO Freq = 2402 |
| M3 counter = 20 | N counter = 2403 | VCO Freq = 2403 |
| M4 counter = 5 | N counter = 601 | VCO Freq = 2404 |
| M5 counter = 20 | N counter = 2405 | VCO Freq = 2405 |
| M6 counter = 10 | N counter = 1203 | VCO Freq = 2406 |
| M7 counter = 20 | N counter = 2407 | VCO Freq = 2407 |
| M5 counter = 5 | N counter = 602 | VCO Freq = 2408 |
| M6 counter = 20 | N counter = 2409 | VCO Freq = 2409 |
| M6 counter = 2 | N counter = 241 | VCO Freq = 2410 |

According to this embodiment, faster reference frequencies are enabled, allowing faster settling times and reduced power consumption by the radio system.

Figure 1:
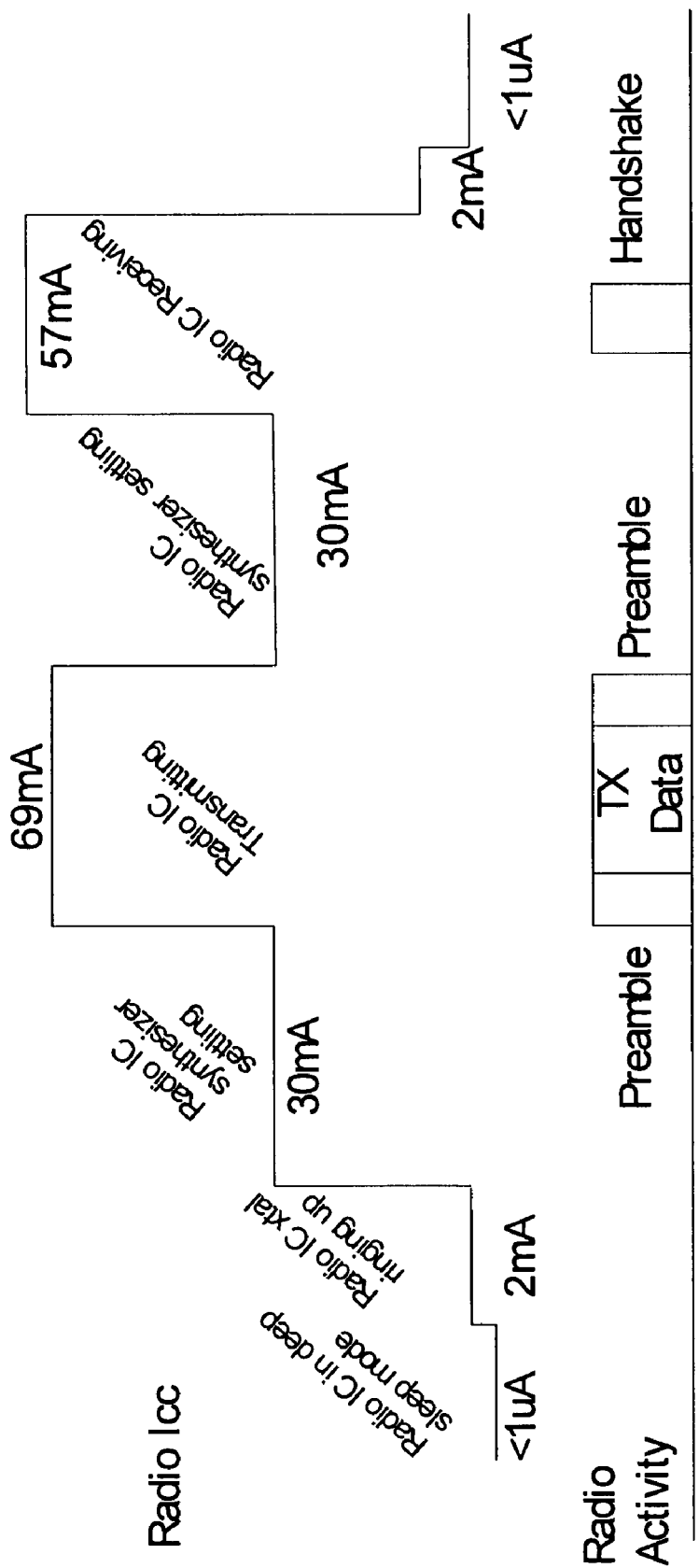
FIG. 1 is a timing diagram showing settling time operation of a conventional radio.
Figure 2:
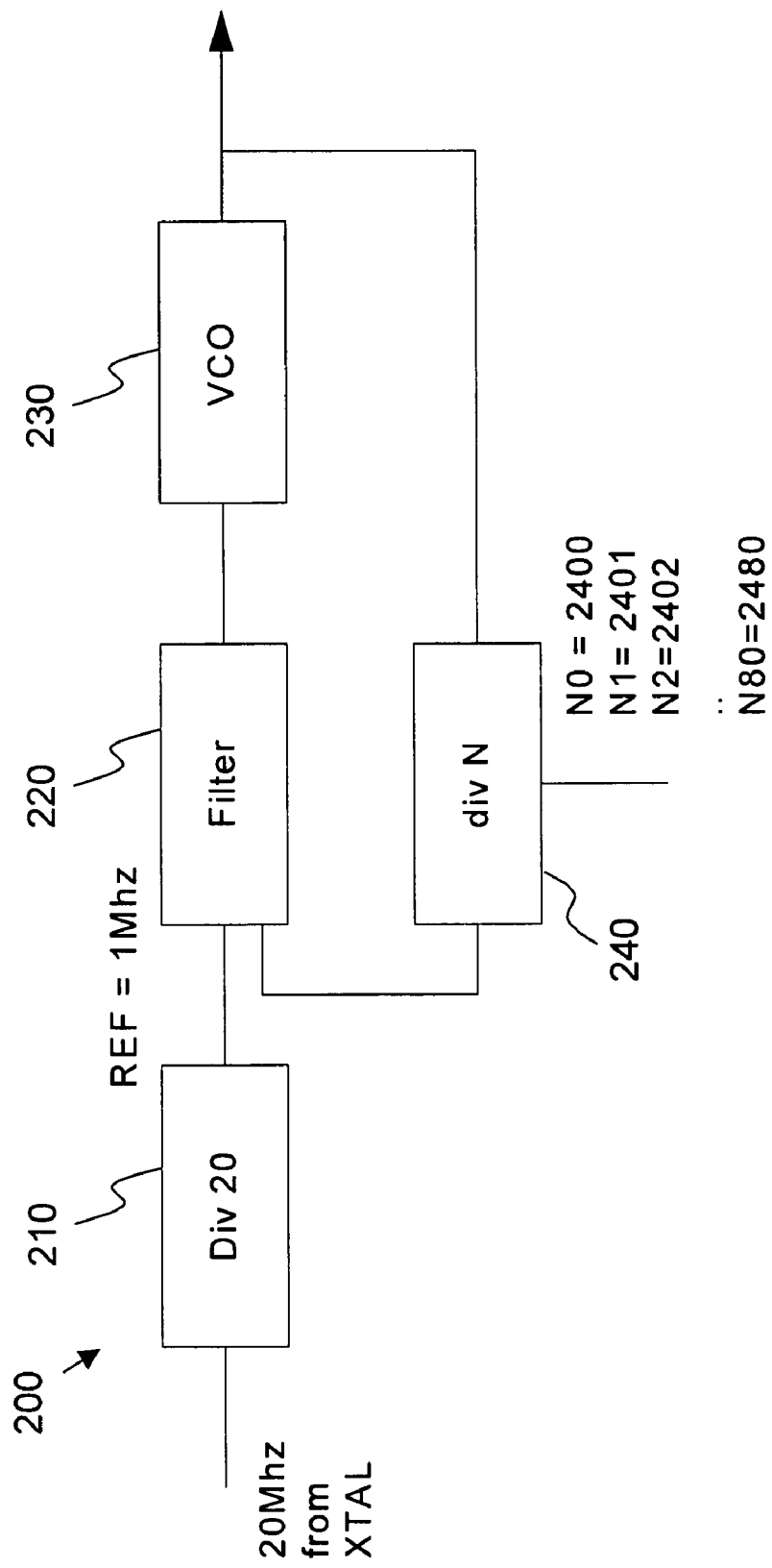
FIG. 2 is a somewhat schematic block diagram showing an architecture of a conventional PLL solution.
Figure 3:
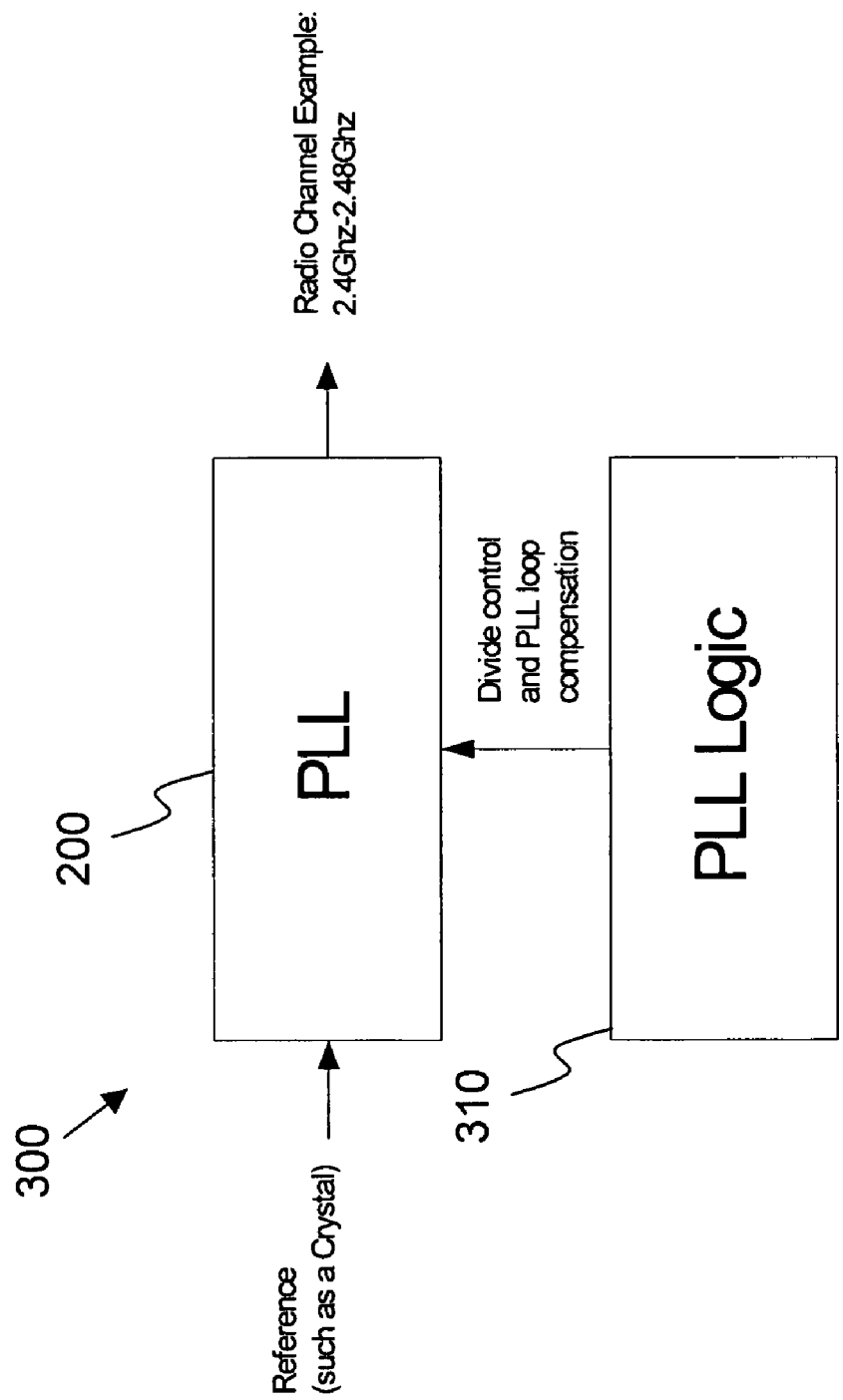
FIG. 3 is a somewhat schematic block diagram of a conventional system comprising the conventional PLL solution of FIG. 2.
Figure 4:
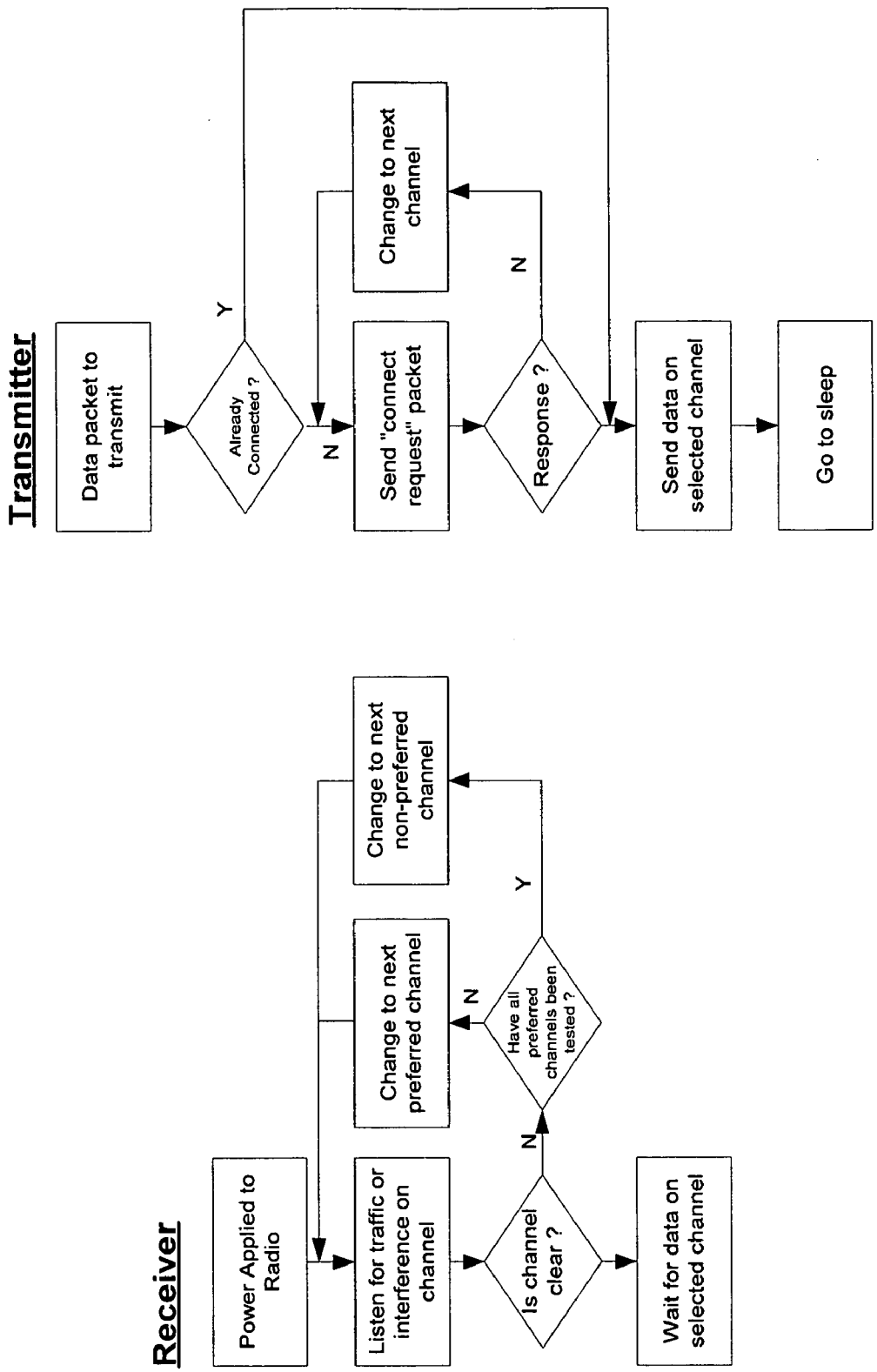
FIG. 4 is a flowchart showing operation of a novel method of finding the preferred channels according to one aspect of the present invention.

A method of using the features of the improved architectures described above to reduce power consumption during transmission of a given packet of data will now be described with additional reference to FIG. 4. Referring now to FIGS. 4-6, an improved synthesizer is preferably designed such that a portion of the channels have a faster settling time. The channels having the faster settling times are preferably designated as "preferred" channels.

Under most practical operating conditions, the radio system 600 may use one of the preferred channels. The resulting reduction of synthesizer settling time when using these channels may lead to a significant reduction in power consumption. Only in rare cases where it is necessary to use a non-preferred channel would the synthesizer settling time be longer, and power consumption consequently higher.

In an improved radio device 600 constructed according to principles of the present invention, the "fast" channels available in the preferred architecture may be used to reduce the power required to transmit a given packet of data. For instance, power consumption can be improved when the radio system 600 incorporates a channel selection protocol that selects a "fast" channel for use if one is available, and only uses a "slow" channel if no "fast" channel is available.

An implementation of such a channel selection method is described for instance with reference specifically to FIG. 4. Referring to FIG. 4, when a receiver is initialized (for example when power is applied), the receiver preferably selects a channel for use. To do this, the receiver preferably scans the available channels to find a channel that is not already in use by another compatible radio system. The receiver also preferably listens for evidence of radio activity from incompatible systems on each channel that it scans.

In a most preferred embodiment, the receiver first scans the preferred "fast" channels. If it finds a fast channel that is free of both other compatible radio traffic and interference, the receiver selects that channel. In this embodiment, only if the receiver is unable to find a "fast" channel that is free of compatible radio traffic and free of interference does the receiver scan the non-preferred, "slow" channels.

In another step, an event occurs that causes the transmitter to need to transmit data. If the transmitter has already established a communications link with the receiver on a given channel during a previous transmission, that channel is considered used. If no previously established link exists, the transmitter searches for the receiver channel. The transmitter may search for a receiver channel by sending a "connect request" packet. The connect request packet preferably contains the unique ID number of the transmitter (which is transmitted to, and stored by the receiver during system configuration). The transmitter preferably transmits a "connect request" packet on each channel in a desired sequence.

In one implementation, for instance, the transmitter may transmit this packet on the "fast" channels first. In another implementation, however, it may transmit on each channel in turn without regard to which channels are fast and which are slow. When the receiver receives a "connect request" packet containing the unique ID of a transmitter with which it has been configured to communicate, the receiver sends a response packet.

In a further step, the transmitter is "connected" to the receiver (i.e., a data link is established), and the transmitter transmits data packets on the channel on which it received a connect response. In another step, the transmitter and receiver preferably continue to use this channel until such time as either the receiver is reset or the channel is found to suffer from interference. The phase lock loop (PLL) may include a programmable M counter and N counter (e.g., integer counters) providing bandwidth adjustment. The wireless communication scheme may also be capable of channel hopping.

In a first alternative embodiment, specific integer M counter and N counter values that are presented can be replaced with other generic integer values. In a second alternative embodiment, the user may elect to use half of the preferred channels, a third of the preferred channels, or any other reasonable combination as desired by the user. In a third alternative embodiment, bandwidth compensation can be provided. This can be done in several ways. For example, bandwidth compensation can be achieved by adjusting the VCO gain (Mhz/V) or by controlling the internal components of the filter.

An improved radio device according to a preferred embodiment of the present invention has been described above having two different categories of settling times. More specifically, in the earlier-described embodiment, the radio device was described as including "fast" and "slow" channels, designated as "preferred" and "non-preferred" channels, respectively. In another alternative implementation, however, three or more different categories of synthesizer settling times may be implemented. In this alternative embodiment, respective speeds of the channels can be identified so that rather than simply having "preferred" and "non-preferred" channels, the channels can be ranked in order of preference based on their speed. In this manner, the method can be modified so that the receiver tries the fastest channels first, then the next fastest, and so on, trying the slower channels only if no faster channel is available.

Various preferred methods of finding a channel have also been described previously in terms of a one-way data stream. In a further alternative embodiment, a method of finding a channel may be implemented in a system in which data may be passed in either direction (bi-directional data exchange). In a bi-directional system, the "receiver" preferably selects the channel to use, and the "transmitter" preferably tries to find the receiver.

In a still further implementation, when no connection (or link) exists, the transmitter may perform the steps described in the earlier embodiment as being performed by the receiver, and vice-versa. Once a connection has been established, the receiver can preferably begin listening on the selected channel for data, and the transmitter preferably only transmits when it has data to send.

In one embodiment, data exchange is asynchronous. The method may also be applied, however, to synchronous systems. In such systems, the "reconnection" process is preferably unchanged. The receiver may poll the transmitter for data periodically, or the receiver and transmitter may each maintain accurate clocks that allow them to exchange data periodically, with a pre-determined interval between transmissions.

As can be seen from the foregoing description of various embodiments, a primary advantage of an improved radio and system constructed according to principles of the present invention is the significant reduction in the amount of power consumed in transmitting data between radios in typical applications and installations.

For purposes of clarity, many of the details of the invention and the methods of designing and manufacturing the same that are widely known have been omitted from the following description. It should also be appreciated that reference throughout this specification to "one embodiment" or "an embodiment" means that a particular feature, structure or characteristic described in connection with that embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. And the particular features, structures, or characteristics of the various embodiments may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, the inventive aspects may lie in less than the combination of all features of any single foregoing disclosed embodiment. Thus, the claims following the detailed description are hereby expressly incorporated into this detailed description, with each claim standing on its own as a separate embodiment of this invention.

Having described and illustrated the principles of the invention in various embodiments thereof, it should be apparent that the invention can be modified in arrangement and detail without departing from such principles. We claim all modifications and variation coming within the spirit and scope of the following claims.

What is claimed is:

1. A method for selecting a preferred channel for radio communication from a plurality of consecutive integer frequencies including preferred channels and non-preferred channels, such that frequency synthesizer settling times of the preferred channels are faster than frequency synthesizer settling times of the non-preferred channels, the method comprising:
   determining a plurality of integer values for use by a frequency divider to divide a fixed input signal, a frequency of the fixed input signal being an integer multiple of each of the plurality of integer values;
   dividing the fixed input signal by one of the plurality of integer values to determine a reference frequency, which is proportional to a frequency synthesizer settling time;
   determining a corresponding integer value for the reference frequency, such that a multiplication of the reference frequency by the corresponding integer value results in one of the consecutive integer frequencies;
   multiplying the reference frequency by its corresponding integer value to generate an integer frequency from one of the plurality of consecutive integer frequencies; and
   when the integer frequency corresponds to a preferred channel:
   scanning the preferred channel for radio activity; and
   selecting the preferred channel for at least one of transmission and reception of a radio signal at the integer frequency responsive the radio activity.

2. A method according to claim 1 wherein selecting the preferred channel comprises:
   selecting the preferred channel when it is free of radio traffic and interference.

3. A method according to claim 1, wherein selecting one or more preferred channels for radio communication further comprises selecting radio channels with low power consumption.

4. A method according to claim 1, further comprising:
   scanning the non-preferred channels when the preferred channels are unavailable; and
   selecting one of the non-preferred channels that is free of radio traffic and interference.

5. A method according to claim 1, further comprising:
   generating the plurality of radio channels with a frequency synthesizer that includes a frequency divider configured to generate reference frequency signals by the dividing, and a voltage controlled oscillator configured to generate the plurality of radio channels responsive to the reference frequency signals from the frequency divider.

6. A method for identifying a preferred channel for radio communication from a plurality of radio channels consecutive integer frequencies including preferred channels and non-preferred channels, the method comprising:
   determining a plurality of integer values for use by a frequency divider to divide an input signal, a frequency of the fixed input signal being an integer multiple of each of the plurality of integer values;
   dividing the input signal by one of the plurality of integer values to determine a reference frequency;
   determining a corresponding integer value for the reference frequency, such that a multiplication of the reference frequency by the corresponding integer value results in one of the consecutive integer frequencies;
   multiplying the reference frequency by the corresponding integer value to generate an integer frequency from the plurality of consecutive integer frequencies; and
   repeating the determining and the multiplying a plurality of times to generate a plurality of radio channels corresponding to the consecutive integer frequencies;
   scanning the plurality of radio channels to find an available channel, wherein preferred channels are associated with a lower power consumption and are scanned before one or more non-preferred channels associated with a higher power consumption;
   listening for radio activity on the available channel; and
   selecting the available channel when it is substantially free from radio traffic and interference, wherein at least one of the one or more non-preferred channels is selected as the available channel only when no preferred channel is substantially free from radio traffic and interference.

7. A method according to claim 6, wherein the reference frequency is inversely proportional to a frequency synthesizer settling time.

8. A method according to claim 6, further comprising:
   generating the plurality of radio channels with a phase lock loop (PLL) having a first programmable counter for generating the plurality of integer values and a second programmable counter for generating corresponding integer values; and
   identifying the one or more preferred channels from the plurality of radio channels responsive to the first programmable counter.

9. A method according to claim 6, further comprising:
   generating the plurality of radio channels with a frequency synthesizer that includes a frequency divider configured to generate the reference frequency by the dividing, and a voltage controlled oscillator configured to generate the plurality of radio channels responsive to reference frequencies from the frequency divider.

10. A method according claim 6, wherein the non-preferred channels comprise channels having slower synthesizer settling times as compared to the preferred channels.

11. A device comprising:
    a receiver configured to:
    identify a preferred channel for radio communication from a plurality of consecutive integer frequencies including preferred channels and non-preferred channels;
    determine a plurality of integer values for use by a frequency divider to divide an input signal, a frequency of the fixed input signal being an integer multiple of each of the plurality of integer values;
    divide the input signal by each of the plurality of integer values to generate a plurality of reference frequencies;
    determine a corresponding integer value for each of the plurality of reference frequencies, such that a multiplication of the reference frequencies by their corresponding integer value results in at least one of the consecutive integer frequencies;

multiply each reference frequency by its corresponding integer value to generate a plurality of radio channels corresponding to the plurality of consecutive integer frequencies;

identify preferred channels and non-preferred channels from the plurality of radio channels, where frequency synthesizer settling times of the preferred channels are faster than frequency synthesizer settling times of the non-preferred channels;

scan the preferred channels for radio activity, select one of preferred channels responsive to the scanned radio activity; and utilize one of the reference frequencies to generate a radio frequency corresponding to the selected one of the preferred channels.

12. The device of claim 11, wherein the selected one of the preferred channels is substantially free of radio traffic and interference.

13. The device of claim 11, wherein the preferred channels are associated with lower power consumption than other radio channels.

14. The device of claim 11, wherein each reference frequency is inversely proportional to a settling time of a frequency synthesizer.

15. The device of claim 11, wherein the receiver is further configured to:

scan one or more non-preferred channels when the preferred channels are unavailable, and select one of the non-preferred channels that is substantially free of radio traffic and interference.

16. The device of claim 15, wherein the non-preferred channels have slower synthesizer settling times than the preferred channels.

17. The device of claim 11, wherein the receiver includes:

a frequency divider configured to generate the reference frequencies by dividing the input signal, and a voltage controlled oscillator configured to generate the plurality of radio channels responsive to the reference frequencies.

* * * * *